FACE-TO-FACE EPITAXIAL DEPOSITION WHICH INCLUDES BAFFLING THE SOURCE AND SUBSTRATE MATERIALS AND THE INTERSPACE THEREBETWEEN FROM THE ENVIRONMENT

Filed Aug. 27, 1965

United States Patent Office 3,493,444

Patented Feb. 3, 1970

3,493,444

FACE-TO-FACE EPITAXIAL DEPOSITION WHICH INCLUDES BAFFLING THE SOURCE AND SUBSTRATE MATERIALS AND THE INTERSPACE THEREBETWEEN FROM THE ENVIRONMENT

Erhard Sirtl and Julius Nickl, Munich, Germany, assignors to Siemens Aktiengesellschaft, a corporation of Germany Continuation-in-part of application Ser. No. 323,307, Nov. 13, 1963. This application Aug. 27, 1965, Ser. No. 496,212

Claims priority, application Germany, Nov. 15, 1962, S 82,453

Int. Cl. H01l 7/36

U.S. Cl. 148—175 11 Claims

Figure 1:
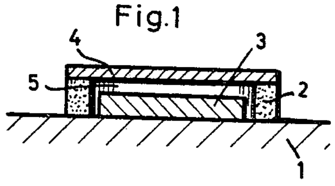

Our invention relates to the production of semiconductor members by precipitating a layer of semiconductor substance from a gaseous compound of that substance upon a preferably monocrystalline carrier or substrate consisting of the same semiconductor material, this application being a continuation-in-part of our application Ser. No. 323,307, filed Nov. 13, 1963 and now abandoned.

With this so-called epitaxial or sandwich method it is important to maintain an optimum distance between the substrate and the body of source material to be converted to the gaseous compound from which the material, upon dissociation of the compound, precipitates upon the substrate. It is therefore advantageous to insert a spacer of inert material between the body of source material, such as a disc-shaped quantity of semiconductor substance, and the substrate to be epitaxially coated. However, it has been difficult to thus produce a large number of semiconducting layers all possessing the desired uniform qualities. Considerable difficulties are particularly encountered when the layers, thus grown in form of a film, wafer or ring, have a thickness of no more than 50 microns, because then the resulting inaccuracies greatly impair the uniformity with respect to the electrical qualities of the epitaxial layers, as contrasted with the production of layers of wafers whose thickness is several hundred microns so that any accuracy within the limits of ±5 microns is more readily permissible.

It is an object of our invention to provide a semiconductor production method, as well as a device for carrying out such a method, generally of the above-mentioned kind that facilitates producing epitaxial layers on substrates in any desired layer thickness, including those below 50 microns, while more reliably securing uniform properties of the grown layers.

To this end, and in accordance with our invention, the process of growing a monocrystalline semiconductor layer upon a preferably monocrystalline carrier or substrate of semiconductor material by dissociation of the layer substance from a gaseous compound thereof, is performed in the following manner by placing a semiconductor substrate above a source quantity of solid semiconductor substance so that it is separated therefrom by an interspace; baffling the source quantity, the underside of the substrate and the interspace therebetween from the environment without sealing the interspace from the environment to permit gas exchange between interspace and environment, subjecting the source quantity to a reaction gas in the interspace and simultaneously heating the support to a temperature at which a transport reaction occurs in the interspace for converting solid substance from the source quantity to a gaseous compound and causing dissociation of the compound and precipitation of the transported semiconductor substance on the substrate.

In other words, a quantity of the semiconductor substance, to serve as source, is placed in solid form upon a heatable support in direct heat-conductive contact therewith, and is surrounded on the top surface of the support by a spacer structure of inert material so dimensioned that when the semiconductor substrate is placed on top of the spacer structure, there will remain above the source quantity of semiconductor substance an interspace which is subsequently available for the transport reaction to be performed. It is essential that this interspace within the confines of the surrounding spacer structure remain in communication with the environment to permit a gas exchange between the interspace and the environment during the subsequent reaction. After the substrate is thus placed on top of the spacer structure, the substrate surface to be epitaxially coated facing downward, the support is heated thus heating the source substance has the further advantage that pulverulent simultaneously the assembly is subjected to a reaction gas which enters into the interspace. As a result, solid substance from the source quantity surrounded by the spacer structure is converted to a gaseous compound. This compound becomes dissociated at the cooler surface of the substrate so that semiconductor substance will precipitate upon the substrate surface where a monocrystalline layer is thus grown by the transport reaction. In this manner, a fixed distance is reliably maintained for the transport reaction between the substrate and the source substance to be converted to the gaseous phase, and the spacing found to be within the optimal range for the transport reaction can be secured and maintained.

The spacer structure according to the device of our invention is preferably constructed as a ring and is given the shape necessary for permitting a gas exchange with the atmosphere or environment surrounding the assembly at any time during the progress of the transport reaction. The use of a ring-shaped spacer around the source substance has the further advantage that pulverulent semiconductor substance can be employed and can simply be pressed into the ring-shaped spacer located on the top surface of the heatable support. However, the source substance to be converted to a gaseous compound can also be used in compact form, for example shaped as a crystalline or monocrystalline circular disc which can simply be laid into the spacer ring prior to placing the substrate on top of the ring.

It has been found preferable, however, to employ the source material in form of a tablet shaped by compression and preferably pre-sintered. By standardizing the diameter of such a tablet and by press-molding an accurately dimensioned quantity of pulverulent material, this mode of practicing the invention affords maintaining strictly uniform fabricating conditions.

The process can be carried out at negative pressure, as well as at normal atmospheric pressure. For operating at normal pressure, care must be taken for ingress and egress of the reaction gas with respect to the interspace surrounded by the spacer structure and covered by the substrate. This can be readily done by properly designing the spacer, for instance by providing it with grooves or serrations at its upper edge.

The spacer can be constructed in various ways. In its simplest form, a bilaterally lapped ring is used which surrounds the starting material, be it powdery or in the form of a compressed tablet or disc, and whose annular and planar top face serves to support the substrate to be coated. Then, however, a gas exchange between the gas within the spacer and the surrounding atmosphere is difficult, so that it is necessary to evacuate the reaction vessel. This can be avoided by providing the annular top face of the spacer with the above-mentioned grooves through which the interior communicates with the environment. The same result is obtained by using an oval spacer ring whose top is covered by the substrate only in the middle portion of the oval shape so that the reaction gases can laterally enter and leave the transport-reaction space.

Various inert materials are suitable for the spacers, particularly quartz and sintered corundum. The spacer rings may also be made of silicon carbide or of carbon coated with silicon carbide.

The method according to the invention is suitable for the production of semiconductor members from the semiconductor elements of the fourth main group, preferably silicon and germanium, as well as for the production of compound - semiconductors, such as silicon carbide, $A^{III}B^{V}$ compounds and $A^{II}B^{VI}$ compounds. Suitable semiconductor substances of the latter types are aluminum phosphide, aluminum arsenide, aluminum antimonide, gallium phosphide, gallium arsenside, gallium antimonide, indium phosphide, indium arsenide, also sulphide, selenide and telluride of zinc, cadmium or mercury, for example: zinc sulphide, zinc selenide, cadmium selenide, cadmium telluride or mercury sulphide.

Doping substances can be added either to the semiconductor source substance or to the reaction gas. Suitable as reaction gases are: halogens and halogenides, such as $Cl_2$, $Br_2$, $I_2$, HCl, $SiCl_4$, $AaCl_3$, either alone or in mixture with $H_2$, $N_2$, argon or other neutral gases.

Figure 2:
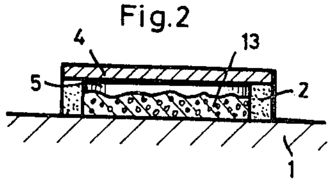
Figure 3:
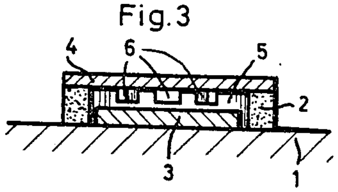
Figure 4:
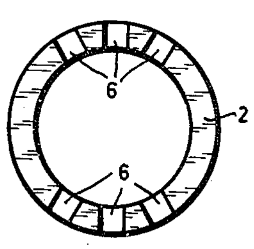
Figure 5:
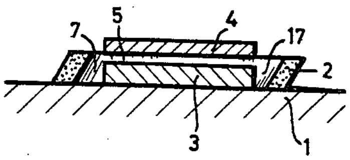
Figure 6:
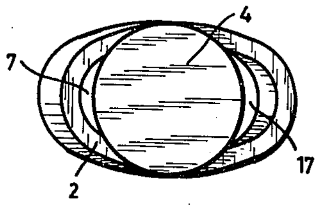

The invention will be further described with reference to embodiments illustrated by way of example on the accompanying drawing in which:

FIGS. 1, 2 and 3 show, each in vertical section, respective support-spacer-substrate assemblies as they come about when practicing the method of the invention. FIG. 4 is a plan view of the ring-shaped spacer structure employed in the assembly according to FIG. 3. FIG. 5 is a vertical section through another assembly comprising an annular spacer of oval shape; and FIG. 6 is a top view of the same assembly. The same reference characters are used in all illustrations for denoting the same components respectively.

According to FIG. 1, a heatable support consisting for example of a sheet of molybdenum or other metal melting at high temperature, supports on its planar top surface a circular spacer ring 2 of quartz or one of the other inert materials mentioned above. The ring 2 is lapped at its planar top and bottom faces and surrounds a circular disc 3 of semiconductor source material, such as silicon, which is placed on the support 1 so as to be in direct heat contact therewith. The substrate 4 to be coated with a silicon film or layer is placed on top of the ring 2, the substrate consisting of monocrystalline silicon and having circular shape so as to cover the entire interspace remaining between the top of the source disc 3 and the top face of the spacer ring 2. The axial height of the spacer ring must be larger than the thickness of the source disc 3 by the distance desired for the transport reaction to be performed. For example, the height of the ring may amount to some hundreds of microns, for example 200 microns, within tolerance limits of $\pm 5$ microns, leaving an interspace, for example of approximately 50% of this height, available for the transport reaction. Thus, the spacer ring serves not only for providing a supporting surface for the substrate 4 to be coated but also for maintaining an accurately determined distance between the disc 3 of source substance and the substrate 4 in addition to baffling the source material disc 3, the interspace and the underside of the substrate 4 from the environment. Used as source disc 3 is either a compact and preferably monocrystalline disc of predetermined size, or a pressed tablet of standardized diameter.

The embodiment shown in FIG. 2 correspond essentially to that of FIG. 1, except that the compact disc of semiconductor source substance is substituted by a mass of pulverulent substance 13. A weighed quantity of this substance is pressed into the ring-shaped spacer 2.

When performing the method of the invention with assemblies as described with reference to FIGS. 1 and 2, the transport reaction can be carried out under normal atmospheric pressure in special cases only, or at a slow rate because the reaction gas supplied to the environment of the illustrated assembly cannot sufficiently rapidly penetrate into the reaction space 5 proper and the spent reaction gas can likewise not escape from that space with the desired rapidity. In this respect, the embodiments according to FIGS. 3 to 6 constitute a considerable improvement.

In the assembly shown in FIGS. 3 and 4, the ring-shaped spacer structure 2 of the assembly, otherwise corresponding to that of FIG. 1, is provided with radial grooves 6 which readily permit a free exchange of gas between the atmosphere in the environment and the reaction space 5 proper.

In the assembly shown in FIGS. 5 and 6, the spacer structure 2' has oval shape. The small diameter of the oval shape corresponds substantially to the diameter of the circular substrate disc 4 to be coated. As a result, there remain lateral openings 7 and 17 through which the interspace 5 is in free communication with the environment.

By baffling the interspace subjected to the transport reaction from the environment by means of the ring-shaped spacer 2, the reaction is restricted substantially to this interspace wherein a quasi-stable condition thus exists that is necessary for successful completion of the transport reaction, and the gaseous compound of semiconductor substance formed thereby is also prevented from dissipating into the environment.

After an assembly is prepared as exemplified by the above-described embodiments of FIGS. 1 to 6, the support 1 is heated. This is preferably done electrically either by passing current through the metallic support, then constituting the electric heater, or by heating the support with the aid of an electric resistance or radiation heater. The disc of semiconductor substance is thus rapidly heated since it is in direct thermal contact with the support. The temperature required for performing the transport reaction depends upon the particular semiconductor substance as well as upon the type and composition of the reaction gas.

For example, if the process serves to precipitate a silicon layer upon a substrate of monocrystalline silicon, silicochloroform mixed with hydrogen is applicable in a $SiCl_4/H_2$ ratio of 1:10. In this case, the substrate, such as a circular disc of 18 mm. diameter, is to be heated to a temperature of about 1150° C. A satisfactory silicon coating on the substrate is produced with a temperature gradient of 3° to 4° C. between the source substance and the substrate surface. Using a source disc 3 and a substrate 4 of p-type and n-type silicon, or vice versa, a satisfactory p-n junction can thus be produced on the substrate within a period of 10 to 25 minutes.

Also applicable as reaction gas for producing silicon layers upon silicon substrates of respectively different conductance type or different specific resistance, is silicochloroform $SiHCl_3$. A suitable $SiHCl_3$ to $H_2$ mixing ratio in this case is 1:12, although smaller and larger amounts of hydrogen, for example up to 20 parts of hydrogen to 1 part of silicon halide may be used. Analogously applicable are the corresponding bromides and iodides of silicon.

When performing the method with other semiconductor substances, the transport-reaction temperature must be correspondingly chosen. For example, the known germanium-iodide process can be employed, passing hydrogen iodide over the source germanium kept at a temperature of 410 to 460° C. the temperature at the substrate surface being, of course, a few degrees lower. With respect to details of the above-mentioned transport reactions, the method according to the invention need not differ from those more fully described in the copending applications Ser. No. 196,625, filed May 22, 1962, of A. Walther; Ser. No. 205,740, filed June 27, 1962 of K. Reuschel, and Ser. No. 209,489, filed July 11, 1962 of K. Wartenberg. However, a complete example of practicing the invention will be described presently.

The following process was performed with the aid of a vessel formed of a water-cooled base plate of copper and a quartz bell placed upon the plate and enclosing a heater having a horizontal top surface as mentioned above. With the bell removed and the heater cold, a circular disc of source substance was placed flat upon the top surface. The disc consisted of monocrystalline p-type silicon of 200 to 300 ohm·cm specific resistance having a diameter of 16.0±0.5 mm. and a thickness of 1 mm. The silicon disc was produced by slicing it from a zone-melted monocrystalline rod and then lapping, polishing and etching the disc. Baffling was provided by a spacer ring cut from a quartz tube and placed on the heater plate around the source disc. The ring was 1.5 mm. high, 18.0±0.2 mm. in diameter, and had a radial wall thickness of 1.2 mm. Both planar sides were lapped, and the top side was provided with 4 radial slots in crosswise arrangement, each 0.1 mm. deep and 0.2 mm. wide. Placed on top of the quartz ring was a substrate disc consisting of monocrystalline (111)-oriented p-type silicon of 0.2±0.1 ohm·cm., having a diameter of 20.8 mm. and a thickness of 300 micron. The disc side to be epitaxially coated was lapped and etched.

After assembling the above-described components in the vessel and placing the bell upon the copper base plate, the interior of the vessel was rinsed for 30 minutes with hydrogen at room temperature. Thereafter the heater was heated to 1200° C., resulting in a substrate temperature of 1150±10° C.; and reaction gas was supplied to the vessel. The gas was composed of hydrogen and 1.5 mole percent silicontetrachloride. It was passed through the vessel at a flow speed of 30 cm. per minute.

Under these operating conditions, an epitaxial silicon layer precipitated on the substrate at a rate of growth amounting to about 0.83 micron per minute. The reaction was performed for 20 minutes, whereafter the assembly was cooled to room temperature in a gas current formed only of hydrogen. The layer thus grown was found to be 17.0±1.5 mm. thick, monocrystalline and of p-type conductance, having a resistance of 100±10 ohm·cm. and no more than 100 to 150 dislocations per cm.$^2$.

We claim:

1. The method of growing a monocrystalline layer of semiconductor substance on a semiconductor substrate by dissociation of a gaseous compound of the substance, which comprises placing an annular spacer structure of inert heat-resistant material on a heatable support, placing a source of solid semiconductor substance on top of the heatable support within the annular space structure in such quantity that the upper level thereof is below the top of the annular spacer structure, placing a semiconductor substrate directly above the source quantity at a location separated from the source quantity by an interspace so that it is supported on the top of the annular spacer structure whereby in the underside of the substrate the source quantity and the interspace therebetween are baffled from the environment, subjecting the source quantity to a reaction gas in the interspace and simultaneously heating the support and thereby the source quantity and the substrate to temperature at which a transport reaction occurs in the interspace for converting solid substance from the source quantity to a gaseous compound and causing dissociation of the compound and precipitation of the transported semiconductor substance on the underside of the substrate.

2. Method according to claim 1 wherein the source quantity of solid semiconductor substance is compact and in shaped form.

3. Method according to claim 1 wherein the source quantity is a pressed and sintered solid pulverulent semiconductor substance in the form of a circular tablet of predetermined diameter.

4. Method according to claim 1 including performing the reaction at atmospheric pressure.

5. Method according to claim 1 including performing the reaction at negative pressure.

6. Method according to claim 1 which comprises heating the support initially at negative pressure in the absence of reaction gas, thereafter applying the reaction gas and performing the transport reaction at substantially atmospheric pressure.

7. Method according to claim 1 wherein the solid semiconductor substance of the source quantity is selected from elemental and compound material of the fourth main group of the periodic system of elements.

8. Method according to claim 1 wherein the solid semiconductor substance of the source quantity consists of a semiconductor $A^{II}B^{VI}$ compound.

9. Method according to claim 1 wherein the solid semiconductor substance of the source quantity consists of a semiconductor $A^{III}B^{V}$ compound.

10. Method according to claim 1 wherein the solid semiconductor substance of the source quantity is doped for extrinsic conductance.

11. Method according to claim 1 which comprises adding dopant in gaseous state to the reaction gas for correspondingly doping the precipitate on the substrate.

References Cited

UNITED STATES PATENTS

| | | | |
|---|---|---|---|
| 3,173,814 | 3/1965 | Law | 148—174 XR |
| 3,178,798 | 4/1965 | Marinace | 148—175 XR |
| 3,291,657 | 12/1966 | Sirtl | 148—175 |
| 3,312,570 | 4/1967 | Ruehrwein | 148—175 |
| 3,312,571 | 4/1967 | Ruehrwein | 148—175 |
| 3,316,130 | 4/1967 | Dash et al. | 148—175 |

L. DEWAYNE RUTLEDGE, Primary Examiner
PAUL WEINSTEIN, Assistant Examiner

U.S. Cl. X.R.

117—106, 201